United States Patent
Abusorrah et al.

(10) Patent No.: US 10,826,428 B1
(45) Date of Patent: Nov. 3, 2020

(54) MONITORING AND FAULT DETECTION METHOD AND SYSTEM FOR PHOTOVOLTAIC PLANTS

(71) Applicant: King Abdulaziz University, Jeddah (SA)

(72) Inventors: Abdullah Mohammed Abusorrah, Jeddah (SA); Yusuf A. Al-Turki, Jeddah (SA); Qi Kang, Jeddah (SA); Siya Yao, Jeddah (SA); Mengchu Zhou, Jeddah (SA)

(73) Assignee: King Abdulaziz University, Jeddah (SA)

( * ) Notice: Subject to any disclaimer, the term of this patent is extended or adjusted under 35 U.S.C. 154(b) by 0 days.

(21) Appl. No.: 16/705,374

(22) Filed: Dec. 6, 2019

(51) Int. Cl.
| | |
|---|---|
| *H02S 50/00* | (2014.01) |
| *G01R 21/06* | (2006.01) |
| *G06N 20/00* | (2019.01) |
| *G06F 16/2455* | (2019.01) |
| *G01W 1/00* | (2006.01) |
| *G06N 5/04* | (2006.01) |

(52) U.S. Cl.
CPC .............. *H02S 50/00* (2013.01); *G01R 21/06* (2013.01); *G01W 1/00* (2013.01); *G06F 16/24553* (2019.01); *G06N 5/04* (2013.01); *G06N 20/00* (2019.01)

(58) Field of Classification Search
CPC .......... H02S 50/00; G01R 21/06; G06N 20/00
See application file for complete search history.

(56) References Cited

PUBLICATIONS

Bird et al., Assessing the Modelling Approach and Datasets Required for Fault Detection in Photovoltaic Systems, Nov. 28, 2019, 2019 IEEE Industry Applications Society Annual Meeting, Baltimore, MD, 6 pp. (Year: 2019).*
Abstract of Bird et al., Nov. 28, 2019, 1 pp. (Year: 2019).*
Wang et al, "Fault diagnosis and operation and maintenance of PV components based on BP neural network with data cloud acquisition," IOP Conf. Ser. Earth Environ. Sci., vol. 227, p. 052063, Mar. 2019.
Huang et al, "Newly-Designed Fault Diagnostic Method for Solar Photovoltaic Generation System Based on IV-Curve Measurement," IEEE Access, vol. 7, pp. 70919-70932, 2019.

(Continued)

*Primary Examiner* — Toan M Le
(74) *Attorney, Agent, or Firm* — W & C IP

(57) ABSTRACT

To ensure photovoltaic (PV) panels at a PV plant constantly operate in an ideal state, an unsupervised system and method of intelligent performance evaluation and data-driven fault detection is used. The system and method enables engineers to check PV panels in time and implement timely maintenance. Monitored data are classified into three subsets: ideal period A, transition period S, and downturn period B. Based on A and B data, two regression prediction models are built which are tree-based and fit the non-continuous PV data well. Real-time measured power is compared with upper and lower reference baselines derived from the two predictive models, respectively. Using threshold ranges, the system and method achieves the instantaneous performance monitoring of PV power generation, and provides failure identification and operation and maintenance (O&M) suggestions to engineers.

8 Claims, 11 Drawing Sheets

(56) References Cited

PUBLICATIONS

Momeni et al, "Fault Diagnosis in Photovoltaic Arrays Using GBSSL Method and Proposing a Fault Correction System," IEEE Trans. Ind. Inform., pp. 1-1, 2019.

Pan et al, "Detection and Assessment of Partial Shading Scenarios on Photovoltaic Strings," IEEE Trans. Ind. Appl., vol. 54, No. 6, pp. 6279-6289, Nov. 2018.

Chen et al, "Random forest based intelligent fault diagnosis for PV arrays using array voltage and string currents," Energy Conyers. Manag., vol. 178, pp. 250-264, Dec. 2018.

* cited by examiner

MONITORING AND FAULT DETECTION METHOD AND SYSTEM FOR PHOTOVOLTAIC PLANTS

BACKGROUND

Currently, photovoltaic (PV) energy represents the third-largest source of renewable energy after wind and hydro. In order to increase the efficiency of their power generation, PV power plants have shifted their focus from large-scale development to large-scale operation and maintenance (O&M). Thus, intelligent O&M methods are widely researched. The objective is for PV power stations to be capable of analyzing their operation process automatically, coping with faulty situations accurately, thus greatly improving the overall efficiency of maintenance and management.

Many intelligent O&M methods are based on a video/image analysis or monitoring database. Video/image-based methods utilize unmanned aerial vehicles (UAVs) or 24-hour cameras to get videos or images of PV stations and then train deep learning models to detect potential anomalies. However, to obtain a reliable and accurate model requires a large number of labelled samples (anomalies in the PV panels, e.g., short circuit and cell cracking). Yet, in most cases PV plants are operated normally, and it is impractical and difficult to get sufficient labelled samples.

Therefore, monitoring-based methods are playing an increasingly important part in intelligent O&M. Most existing PV plants have been equipped with sensors and monitoring systems. These systems are able to record detailed historical data and technical parameters of every piece of equipment. Unlike video/image-based methods which rely on additional UAVs or high-resolution cameras, the monitoring-based methods are directly applicable to conventional PV systems and often cost far less on equipment than video/image-based ones.

Unfortunately, there are two shortcomings in existing monitoring systems. First, the interpretation of stored data requires a technical background. Query of the database is usually allowed and data can be organized in plots and tables; however, interpretation is left to the users of such monitoring systems. The curves from the monitoring systems are simply values of current and voltage and do not give much information by themselves. Only experienced engineers who are proficient in the process of photoelectric conversion can tell from it whether photocells are healthy or not. Second, a large number of curves are produced every day. Many PV plants record operational data every 10 minutes or even every minute. It is challenging and time-consuming for engineers to distinguish useful and critical information from such huge data. Consequently, intelligent detection methods and instantaneous warnings are in desperate need for present PV monitoring systems.

Methods of intelligent O&M and fault diagnosis using monitoring data can be generally categorized into PR (performance ratio) methods, I-V (current-voltage) curve methods, statistical methods, and prediction (machine learning-based) methods.

In PR methods, the yield of a PV system is evaluated by the ratio between the measured power and the nominal power (which requires precise formulas to calculate) of a system. A low value can be an indicator of potential anomalies.

In I-V approaches, the I-V curve of a normally operating PV panel is considered as standard characteristic. The mismatch between the standard and real-time ones is used as the judgement of failures. Similarly, the dI/dV-V curves can also be used to detect failures in PV panels, where dI/dV values are the gradients of I-V curves.

Statistical methods do not require any model training, but identify abnormal operation based on the statistical characteristics of individual PV feature (e.g. current and voltage). Statistical methods use the $3\sigma$ rule, Hampel identifier, box-plot and so on; or are based on statistical tests, such as ANOVA test and Kruskal-Wallis test.

Prediction methods firstly train a machine learning-based model to directly predict whether PV panels are normal or not. Wang et al. (*IOP Conf. Ser. Earth Environ. Sci.* (March 2019) 227:052063) propose a fault diagnosis and O&M method based on backpropagation (BP) neural network with data cloud acquisition. Huang et al. (*IEEE Access* (2019) 7:70919-70932) utilize the AdaBoost algorithm to establish a fault diagnostic model. Momeni et al. (*IEEE Trans. Ind. Inform* (2019) pp. 1-9) use a graph-based semi-supervised learning (GBSSL) algorithm to identify, classify, locate and correct faults. Ma et al. (*IEEE Trans. Ind. Appl.* 54(6):6279-6289 (2018)) focus on a partial shading scenario, and apply a multiple-output support vector regression (M-SVR) to estimate the shading strength. Chen at al. (*Energy Conv. Management* 178:250-264 (December 2018)) propose a random forest (RF) based fault diagnosis model and take the real-time operating voltage and string currents of the PV arrays as fault features. Such machine learning-based models can detect faults in real-time and classify their specific type with high prediction accuracy. But these methods require data to be collected from both normal and faulty conditions.

SUMMARY

In one embodiment of the invention, a system and method is described which is an unsupervised prediction method. In operation, the system and method predict power generation and make two comparisons between the predicted and actual ones. The invention advances the area of intelligent O&M based on a prediction model in at least the following aspects:

1) Applying Unsupervised Detection Method.

A PV panels' performance depends on meteorological conditions, and a large number of false and real faults conditions may appear. It is difficult to get a dataset covering all possible fault scenarios. Thus, some methods must artificially produce labeled anomalous data by intentionally making some open circuit or short circuit to PV panels. It undermines the total power generation of PV stations and declines their operation efficiency. On the contrary, the inventive method is unsupervised without relying on the labelled samples, and simply makes use of the existing monitoring data to detect anomalies.

2) Conducting Two Comparisons Based on Two Baseline Models.

In most existing methods, the comparison is between the measured value and only one reference. Such comparisons in these methods is too rigid, and can be prone to frequent false alarms. In our work, the measured value is compared to two baselines, A and B, which mean the upper and lower reference, respectively. By analyzing the different conditions of real-time values in the defined range [A, B], the inventive system and method is able to accurately distinguish different PV performance.

3) Utilizing Only Power Data and all Available Meteorological Data.

Among all electrical data, the inventive system and method uses only power to conduct analysis, and requires no other data. Thus, the inventive system and method reduces the sensor cost of each panel. Note that, in I-V methods, both current and voltage data are required to get the reference or prediction. Although PR methods utilize only generated power, they do not take meteorological factors into consideration, like air temperature and irradiation. Statistical methods also neglect the interconnection between weather data and PV outputs. But meteorological information exerts direct influence on the performance of PV plants (see Oliveri et al. *IEEE Trans. Ind Inform* 13(1):157-165 (2017)). Some machine learning-based methods consider only one or two kinds of meteorological information, which inevitably leads to high error in prediction. Instead, in some embodiments the system and method of the invention takes all available meteorological data (including 6 original features and 3 new features) as the input of the prediction model. In this way, not only can the proposed method require low investment on sensors, but also presents a more accurate prediction.

DETAILED DESCRIPTION

One objective of the O&M framework is to enable PV system production to reach its expected level of efficiency intelligently. So, the approach aims at PV system failure detection, performance evaluation, and O&M planning. The notations frequently used in this paper and their descriptions are summarized in Table I. The concrete steps of the method components of the system are detailed below.

TABLE I

NOTATIONS AND DESCRIPTIONS

| Notation | Description |
|---|---|
| A | A ideal period |
| S | A transition period |
| B | A downturn period |
| p | PV power generation within 15 minutes (KWh) |
| r | Solar irradiance (W/(m$^2$) |
| t | Temperature of a PV panel (° C.) |
| h | Relative humidity (%) |
| v | Wind velocity (m/s) |
| d | Wind direction (0°-360°) |
| D | Original overall dataset of PV power, consisting of m |

TABLE I-continued

NOTATIONS AND DESCRIPTIONS

| Notation | Description |
|---|---|
| $D = \{x_i, i = 1, 2, \ldots, m\}$ | observations, $x_i$ represents the i-th historical PV power data |
| $D_A$ | Subset of selecting A data from D |
| $D_B$ | Subset of selecting B data from D |
| $D_a$ | Subset after removing outliers from $D_A$ |
| $D_b$ | Subset after removing outliers from $D_B$ |
| $\mu_i, i = 1, 2, \ldots, k$ | Cluster centroids, k centroids in total |
| $C = \{C_i, i = 1, 2, \ldots, k\}$ | Clustered dataset, cluster $C_i$ represents the i-th class, k classes in total |
| $Max_i, i = 1, 2, \ldots, k$ | The maximum value of cluster $C_i$ |
| $Min_i, i = 1, 2, \ldots, k$ | The minimum value of cluster $C_i$ |
| $l_i \in \{1, 2, 3, \ldots, k\}$, $i = 1, 2, \ldots, m$ | Class label of the i-th sample in D |
| $R_a = \{a_i, i = 1, 2, \ldots, n\}$ | Dataset of PV power prediction from the upper baseline model, n predictions in total |
| $R_b = \{b_i, i = 1, 2, \ldots, n\}$ | Dataset of PV power prediction from the lower baseline model |
| $R_{\hat{a}} = \{\hat{a}i, i = 1, 2, \ldots, n\}$ | Dataset of modified upper bound prediction |
| $R_{\hat{b}} = \{\hat{b}i, i = 1, 2, \ldots, n\}$ | Dataset of modified lower bound prediction |
| $\alpha_1, \alpha_2, \beta_1, \beta_2$ | Coefficients that divide up a baseline range |
| w | Weather scale factors |

Figure 1:
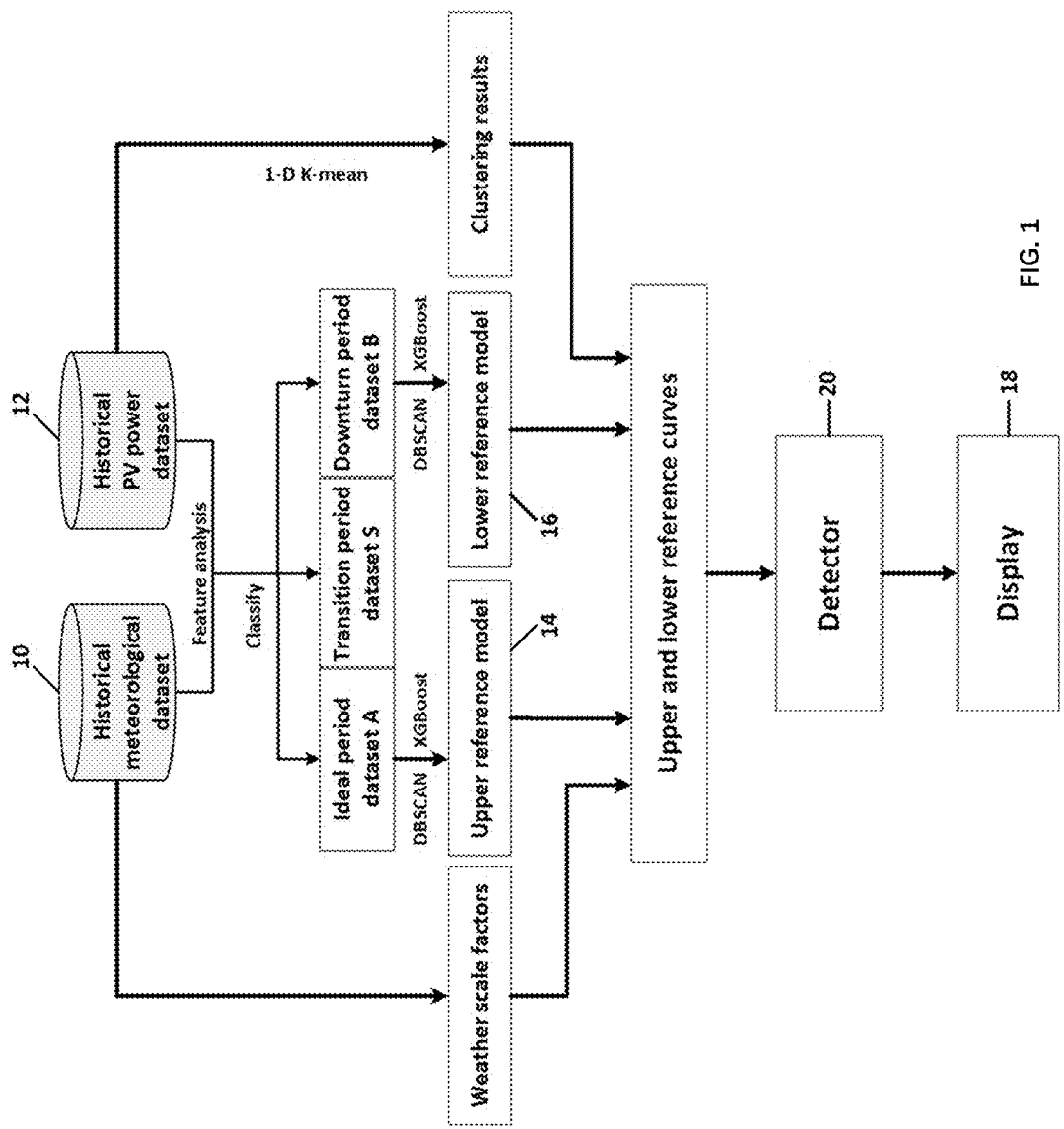
FIG. 1 is schematic diagram which provides a description of the components of the inventive system and operations performed in the inventive method.

A general framework of the system and method is presented in FIG. 1. First, we apply feature analysis to both historical meteorological and PV power datasets 10 and 12. Then, historical data are classified into three subsets that represent different operational statuses, namely, ideal period dataset A, transition period dataset S and downturn period dataset B. Upper and lower reference models 14 and 16 are prepared using outlier removing and regression analysis. A variety of techniques may be used for this purpose. In our implementation, we use DBSCAN-based outlier removing method and XGBoost-based regression method to dataset A and dataset B, so as to train upper and lower baseline models of a PV plant's power output. Moreover, due to very low PV generation in bad weather (e.g. rainstorm, blizzard, hail and sandstorm), we consider its corresponding weather scale factors to revise both references. Also, since PV power data are noncontinuous, we deploy k-means to cluster hierarchical PV power data and use the statistical results of every cluster to further modify the prediction value. Thus, by integrating the results of upper and lower reference models, weather scale factors, clustering results, we acquire the final upper and lower reference curves. Comparing the measured power with two reference curves, we can evaluate their performance, detect faults, and carry out intelligent O&M.

A. Feature Analysis

In the above framework, first, we carry out feature analysis and pay attention to power data. Faults inevitably affect generated power of a PV station. It is thus used as a fault indicator in a detection phase. Both DC current and voltage output are unsuitable to be used as sensitive indicators in this phase. Therefore, the framework described herein stresses the analysis of power data.

PV power data exhibit variability and volatility caused by environmental factors. The fluctuation and uncertainty of meteorological factors directly exert impact on PV power generation. Particularly, under the nonstationary illumination intensity in cloudy and rainy days, PV data are prone to fluctuating violently without any stable pattern. Second, due to the current-limiting nature, a PV system has nonlinear output characteristics of power generation. They increase difficulties and challenges for accurate prediction of PV output. In addition, there are many outliers in the monitoring database. Among the raw data originated from a PV plant, there are various kinds of anomalies, such as missing values, duplicates, and abnormal values, caused by the errors in sensors and probably the failure of transmission.

B. Original Data Classification

In the inventive system and method, a critical part is to build two models: upper and lower baseline models 14 and 16. It is of great importance to select suitable valid data from the original data and input them to train two models. The system and method digs out the original data D and classifies them to obtain the ideal period dataset $D_A$ and the downturn period dataset $D_B$ for the upper and lower model, respectively.

Figure 3:
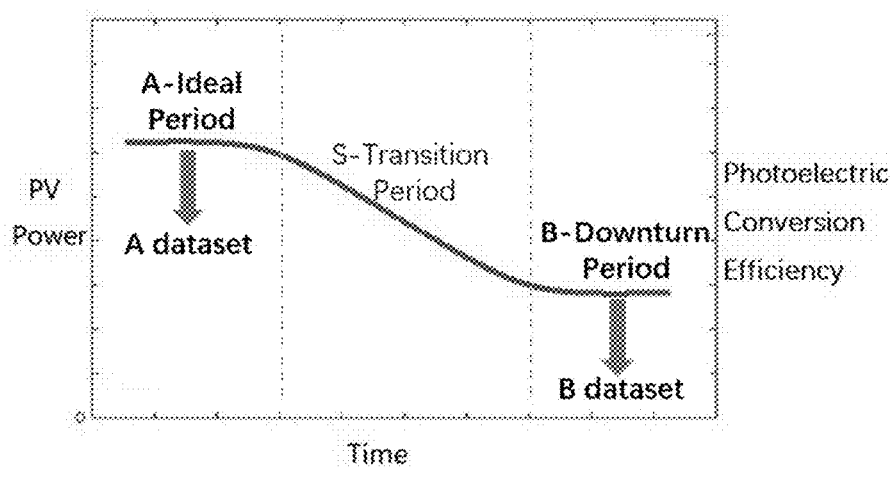
FIG. 3 is graph showing different periods of power generation of PV system with an initial high level of output which transitions to a low level of output.

For most PV plants, as time goes by, if there are no faults during running, the PV panels degrade due to dust or module deterioration. Thus, the power generation presents a declining tendency as shown in FIG. 3. The state of PV panels can be divided into the following three periods:

1) Ideal period A: The first time when the panels are brought into operation or after maintenance (e.g., cleaning and washing), the photovoltaic panel is in a clean state without any light barriers. At this time, the efficiency of photoelectric conversion is comparatively high. The power generation in a PV plant is also at an ideal state, namely, relatively high and stable.

2) Transition period S: Under a natural state and without any interference, PV panels gradually accumulate dust and some light barriers (e.g., bird dropping, leaves, snow and plastic bags). Under this circumstance, the conversion efficiency slows down, and power generation gradually declines too. The total PV power generation makes a gradual transition from ideal state to a lower state.

3) Downturn period B: When there is too much dust or light barriers on PV panels, PV cells receive little solar irradiation, or when they are aging. The photoelectric conversion efficiency reaches its lowest limit, and the generated power continues to be sluggish.

Among these operating periods, the system and method described herein pay special attention to A and B periods. In the practice of the system and method of this invention, data is collected from these two periods to construct the ideal period dataset $D_A$ and downturn period dataset $D_B$.

C. Upper and Lower Regression Models

The system and method builds the upper and lower baseline models with $D_A$ and $D_B$, respectively. The procedure of these two models are similar, and the only difference lies in a different PV dataset input for training. First, outlier detection methods are applied to the historical dataset $D_A$ (or $D_B$), so as to prepare for a prediction model. Meanwhile, the data characteristics of variability and noncontinuity inspire the use of a tree-based regression method. Then, an XGBoost-based model is trained with the cleaned data $D_a$ (or $D_b$). Afterwards, by inputting real-time meteorological information, we are able to conduct the final PV generation prediction and acquire the upper reference $R_a$ (or lower reference $R_b$).

D. Prediction Values Modification

The system and method consider two ways to further modify prediction values. First, although the proposed tree-based regression model is suitable for fitting noncontinuous PV data, it is still a regression method and cannot avoid the emergence of inexistent values. Therefore, they are modified with the minimum or maximum values of the closest cluster. One can utilize k-means to cluster the original 1-D power data. For the prediction value $a_i$ in the upper prediction set $R_a$, if it does not belong to any cluster, then the principle of proximity is adopted to correct it. In the practice of the system and method, preferably you replace it with the maximum value of the closest cluster. The modified prediction value is $$\hat{a}_i = \underset{Max_j}{\mathrm{argmin}}(|a_i - Max_j|), j = 1, 2, \ldots, k \quad (1)$$

where $Max_j$ is the maximum value of the j-th cluster.

Similarly, for $b_i$ located beyond any existing cluster, it is modified with the closest minimum value, as follows:

$$\hat{b}_i = \underset{Min_j}{\mathrm{argmin}}(|b_i - Min_j|), j = 1, 2, \ldots, k \quad (2)$$

where $Min_j$ is the minimal value of the j-th cluster.

Second, when predicting expected PV generation in bad weather (here, bad weather refers to greatly unstable irradiance or extremely low irradiance), they are multiplied by weather scale factors. In the proposed method, a weather scale factor w is defined as the percentage of reduction of power generation in bad weather. It can be simply computed as the ratio of average power output from a normal day to that of a bad weather day.

The prediction value modifying algorithm is realized in Algorithm 1.

| Algorithm1: Modify Prediction Values |
|---|
| Input: dataset D = {$x_1, x_2, \ldots, x_m$}, number of clusters k,<br>    prediction from an upper model $R_a$ = {$a_1, a_2, \ldots, a_n$},<br>    from a lower model $R_B$ = {$b_1, b_2, \ldots, b_n$}.<br>Output: modified upper and lower prediction values<br>    $R_{\hat{a}}$ = {$\hat{a}1, \hat{a}_2, \ldots, \hat{a}_n$}, $R_{\hat{b}}$ = {$\hat{b}_1, \hat{b}_2, \ldots, \hat{b}_n$}<br>1.    Initialize cluster centroids $\mu_1, \mu_2, \ldots,$ and $\mu_k$ randomly<br>2.    For each sample $x_i$ in D<br>3.        classify it into the closest category:<br>4.        Let $l_i = \mathrm{argmin}_{1 \leq j \leq k} \|x_i - \mu_j\|$<br>5.        Moving each cluster centroid $\mu_j$ to the mean of<br>6.        the points assigned to it: $\mu_j = (\Sigma_{i \in c_j} x_i)/|c_j|$<br>7.    Repeat the last two steps until the change of centroids is less<br>8.    than a certain threshold<br>9.    Obtain the clustered data C = {$C_1, C_2, \ldots, C_k$}<br>10.   For each cluster $C_i$ in C<br>11.   Let $Max_i = \max\{x_j | x_j \in C_i\}$, $Min_i = \min\{x_j | x_j \in C_i\}$<br>12.   For each prediction $a_i$ in $R_a$<br>13.        If $a_i \in \cup_{j=1}^{k}[Min_j, Max_j]$<br>14.        Let $\hat{a}_i = a_i$<br>15.        Else do Equation (1)<br>16.   For each prediction $b_i$ in $R_b$<br>17.        If $b_i \in \cup_{j=1}^{k}[Min_j, Max_j]$<br>18.        Let $\hat{b}_i = b_i$<br>19.        Else do Equation (2)<br>20.   Match weather scale factor w<br>21.   Let $\hat{a}_i = w\hat{a}_i$, $\hat{b}_i = w\hat{b}_i$<br>22.   Return modified upper and lower prediction values<br>23.   $R_{\hat{a}}$ = {$\hat{a}1, \hat{a}_2, \ldots, \hat{a}_n$}, $R_{\hat{b}}$ = {$\hat{b}_1, \hat{b}_2, \ldots, \hat{b}_n$} |

E. Performance Evaluation, Fault Detection, and O&M Planning

Generally, a PV system can be affected by different types of faults that result in the significant loss of power. According to the factor causing PV faults, two types of faults can be distinguished: direct and indirect faults. Some direct faults such as cell cracking, non-connected module, open circuit and short circuit in a PV system, broken fuse or cable, and theft, cause conspicuous performance loss. Indirect factors, such as shading due to dust or light barriers, encapsulation degradation due to ultraviolet and yellowing EVA (ethylene vinyl acetate), module degradation due to light or heat, and rust due to water infiltration, lead to the gradual deterioration of PV panels, and hence result in the gradual power loss. Using the monitored data, a monitoring system has to decide whether there is degradation in a PV panel output performance.

In the system and method of the invention, two power-versus-time reference curves (a and b) from regression models are displayed in the monitoring system. For example, this could be a computer display, monitor, or other type of video screen 18 or other output device (e.g., printer, etc.). Meanwhile, the curve of real-time PV power (p) is exhibited in the same figure. The system and method evaluates the PV panels' status by comparing p with a and b. As in Table II, generally, according to different conditions, there are five different stages. They are classified into four typical statuses: malfunction period in Stages 1 and 5; ideal period in Stage 2; transition period in Stage 3; and downturn period in Stage 4.

TABLE II

FIVE DISTRIBUTION OF POWER DATA AND CORRESPONDING STATUS

| Stages | Conditions | Periods |
|---|---|---|
| Stage 1 | Far above A baseline $p > (1 + \alpha_1)a$ | Malfunction period |
| Stage 2 | Fluctuating near A baseline $(1 - \alpha_2)a < p < (1 + \alpha_2)a$ | Ideal period |
| Stage 3 | Within two baselines $(1 + \beta_2)b < p < (1 + \alpha_2)a$ | Transition period |
| Stage 4 | Fluctuating near B baseline $(1 - \beta_2)b < p < (1 + \beta_2)b$ | Downturn period |
| Stage 5 | Far below B baseline $p < (1 - \beta_1)b$ | Malfunction period |

If real-time power exhibit more than a given percentage of generation losses, they are classified into a downturn or malfunction period. The system and method of the invention set $\alpha_1$, $\alpha_2$, $\beta_1$, and $\beta_2$ ($\alpha_1 > \alpha_2$, $\beta_1 > \beta_2$ and $\alpha_1$, $\alpha_2$, $\beta_1$, $\beta_2 \in [0,1]$) to divide up the warning range. Users receive an alarm (visual, audible, etc.), such as from a detector 20, if a PV panel produces more than $\alpha_1$ of the A baseline, i.e., $p > (1+\alpha_1)a$, or less than $\beta_1$ of the B baseline, i.e., $p < (1-\beta_1)b$, which means that the sensors or PV panels may break down or the data transmission is incorrect. If p is fluctuating near B baseline, i.e., $(1-\beta_2)b < p < (1+\beta_2)b$, the PV panels are of low efficiency, and they need timely maintenance, such as manual cleaning and equipment repair. For $\alpha_i$ and $\beta_1$, smaller values mean stricter alert and more sensitive detection; larger values mean looser limitation, but helps reduce false alarms. On the contrary, a larger $\beta_2$ may result in more data classified into the downturn period, hence bring in more false alarms.

If p is near A baseline, i.e., $(1-\alpha_2)a < p < (1+\alpha_2)a$, it indicates that the PV power generation is in an ideal state. There is no need to implement any maintenance. Also, there is no warning or alarm when p is between A and B baseline, i.e., $(1+\beta_2)b < p < (1-\alpha_2)a$, it is in the transition period, and the system and method may consider it as a normal life cycle of PV panels. Note that, if $\alpha_2$ is too large, there are more data classified into the ideal period, leading to the risk of misclassification of potential faults Example Data Description The system and method was employed at a 6.95 MW PV plant. Available monitoring data consist of 5936 records from a seven month period. As indicated above, we used power data and meteorological data, namely, the total PV generation within 15 minutes (p), solar irradiance (r), temperature of PV panel (t), relative humidity (h), wind velocity (v), wind direction (d), and time-related information. All available meteorological data and time-related data are the input of the proposed baseline models, and power generation is the output. In addition, the system and method built in three more inputs: $r_d$, $r_l$, and $h_l$. Input $r_d$ is the differential irradiance between two adjacent r values. Inputs $r_l$ and $h_l$ are the logarithmic values of r and h, respectively.

Experiment and Result

1) Feature Analysis

To explore raw data intuitively, we reviewed plotted PV data for a week. Only daytime hours (mostly from 6:00 to 18:00) were considered. Our analysis showed that PV power experiences violent fluctuation within a day as well as drastic variation among days. In addition, our analysis of measured PV power data versus time demonstrated that PV power data is non-continuous, and showed many blank gaps between data dots. This is consistent with the discussion presented above. The characteristics of raw data, namely, intensive fluctuation and variability, hierarchical noncontinuity, and intricate probability distribution, motivated us to apply an XGBoost method that best suits noncontinuous PV power regression applications.

2) Original Data Classification

As detailed above, we aim to select appropriate data for two datasets, $D_A$ and $D_B$, reflecting the ideal and downturn periods, respectively.

First, we obtained dataset A by considering maintenance records of a PV plant. The scheduled maintenance plan for one year was to do the cleaning work every month. This cleaning lasts nearly half a month (from $16^{th}$ to the end of that month). Under these circumstances, with frequent cleaning, PV panels always stay in a comparatively clean status, namely, the ideal period. However, to help demonstrate the utility of the described system and method, we need the downturn period data. To obtain this data, we stopped the monthly cleaning for three months. Moreover, for dataset A, we consider that PV panels are perfectly clean 2 days after cleaning, so we took data from $18^{th}$ to the end of the month for a four month period for dataset A.

As discussed above, in order to obtain valid dataset B, we suspended the monthly cleaning for three months. Without cleaning, PV panels depend on the rain to wash away dust or other light barriers. So, actions were taken to find data that originated from continuous sunny days, where PV panels may be covered with dust or light barriers, and are in the downturn period, as discussed above. By checking the historical weather, which is freely available online, we were able to select suitable valid data as a dataset B. For example, in one of the months it was rainy in the first week. Thus, the data for this week are not appropriate for B data. But for the remainder of that same month, it was cloudy, overcast or sunny, which suits our selection of a dataset B.

3) Upper and Lower Regression Models

We applied XGBoost to train both upper and lower baseline models. Table III presents the model performance on training and test datasets. RMSE is low on two test datasets, $R^2$ is very close to 1 on both models, indicating that the two prediction models are highly accurate and reliable. But MAE of the lower baseline model is a bit higher than that of the upper one, which results from the deficiency of B data as training data.

TABLE III

PERFORMANCE METRICS OF TWO BASELINE MODELS

| Performance | Upper Baseline Model | | Lower Baseline Model | |
| --- | --- | --- | --- | --- |
| Metrics | train | test | train | test |
| RMSE | 3.6236 | 32.6494 | 9.3065 | 21.9863 |
| MAE | 0.0591 | −13.7615 | 30.4858 | 108.7662 |
| $R^2$ | 0.9999 | 0.9898 | 0.9983 | 0.9915 |

Figure 4:
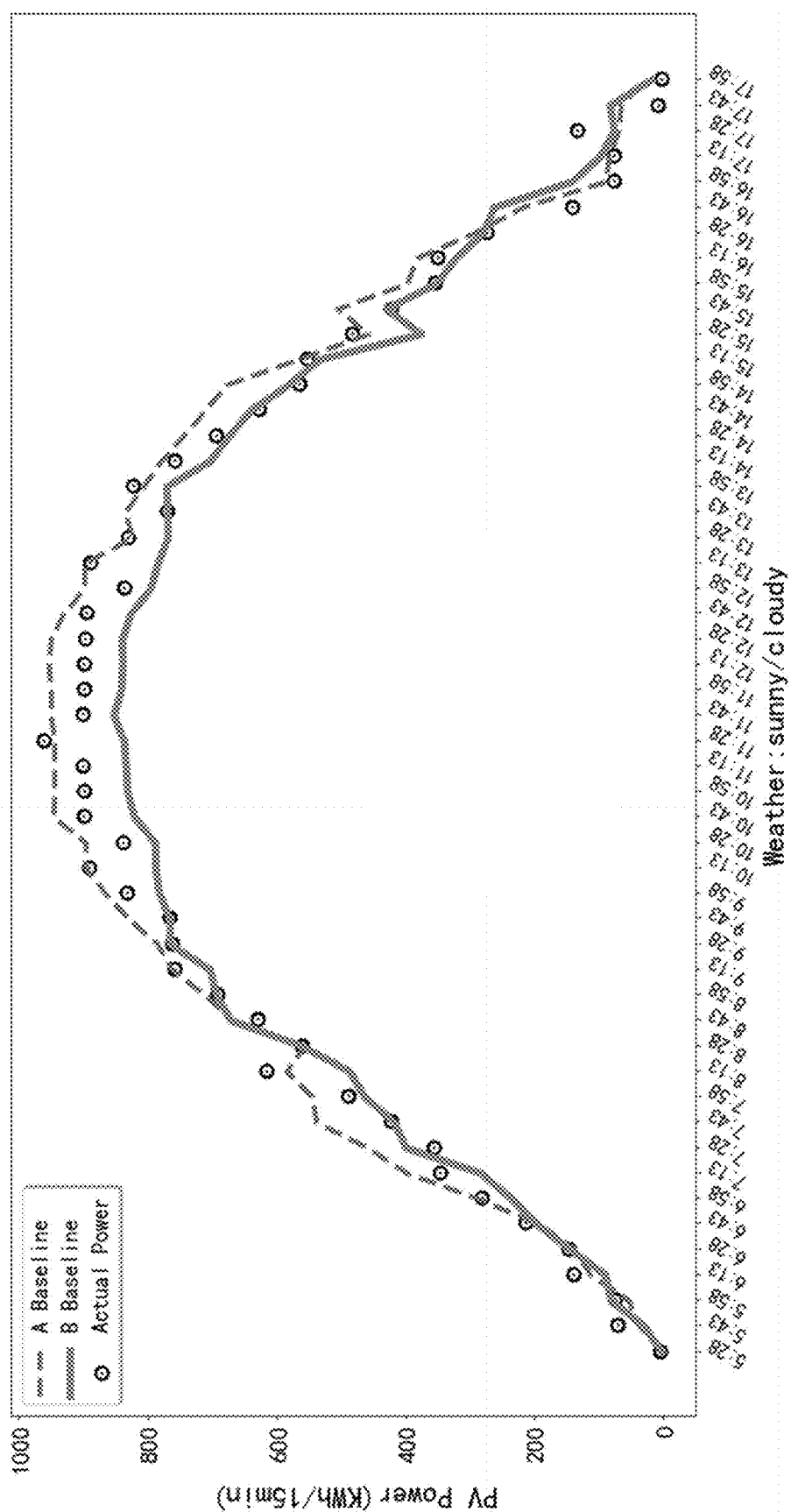
FIG. 4 is a graph showing the measured power of a PV system compared to unmodified curves for the upper reference line and lower reference line.

In FIG. 4, two trained models are applied to the monitoring data in on a particular day, which are presented as black hollow circles. The generally upper dashed curve is the upper reference line from the A baseline model, and the generally lower curve is the lower reference line deriving from the B baseline model. It is noticeable that lower curve is sometimes over the upper cover, e.g., curves during 5:28-6:43, 8:28-9:28, and 16:28-17:58. These overlaps indicated that we should revise two models. What's more, there are many observations below or above the reference lines. Yet, the reference lines are supposed to include most of the monitoring data. These data beyond the reference range also suggest that two reference lines require further modification.

4) Prediction Values Modification

As discussed above, we deployed a k-means clustering algorithm to classify original PV power data and then took the clustering results to modify the prediction values. In the k-means algorithm, we set k=16 to make sure that our power data are exactly classified into 16 classes.

Figure 5:
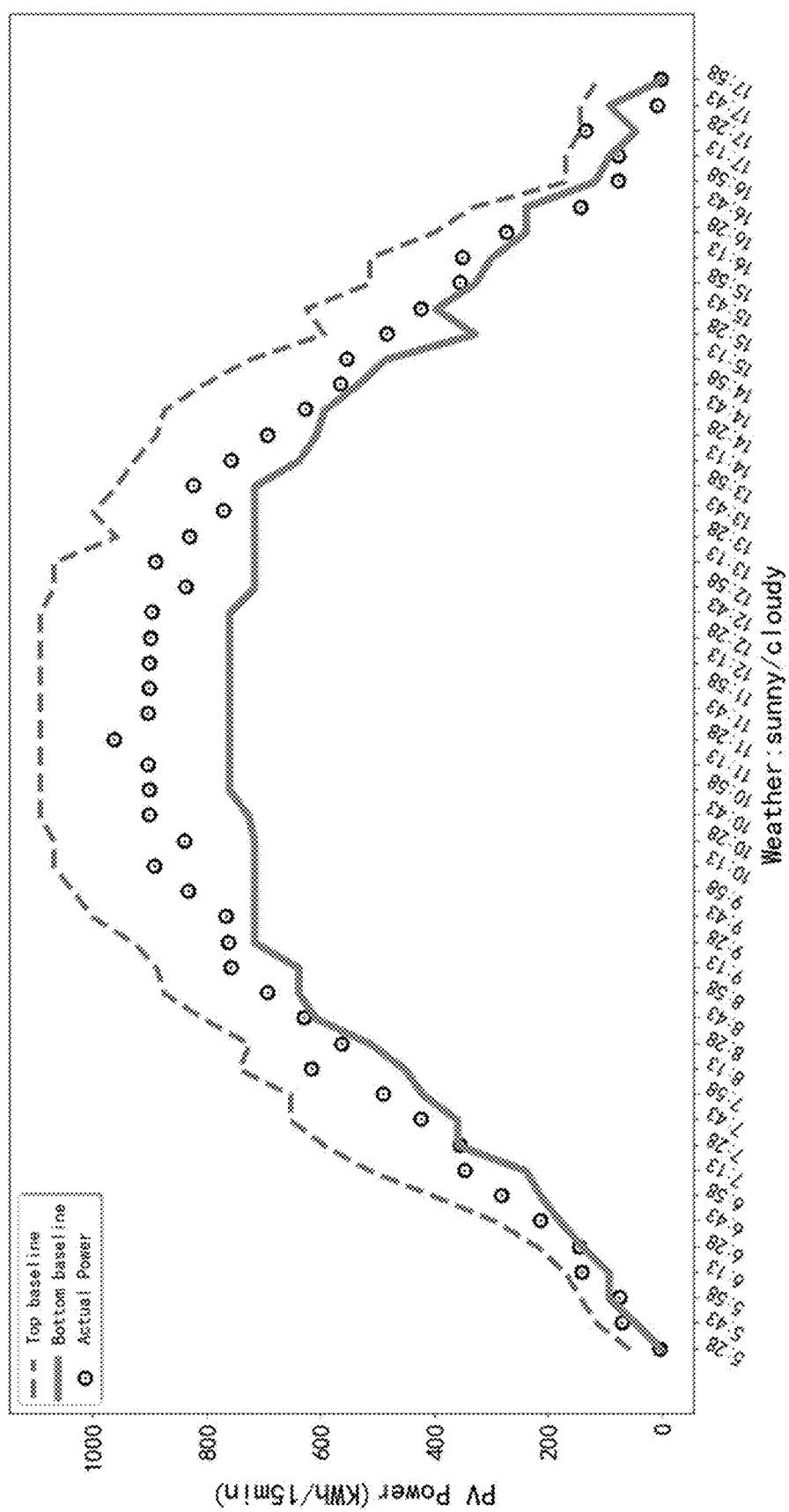
FIG. 5 is a graph showing the measure power of a PV system compared to modified curves for the upper reference line and the lower reference line.
Figure 6A:
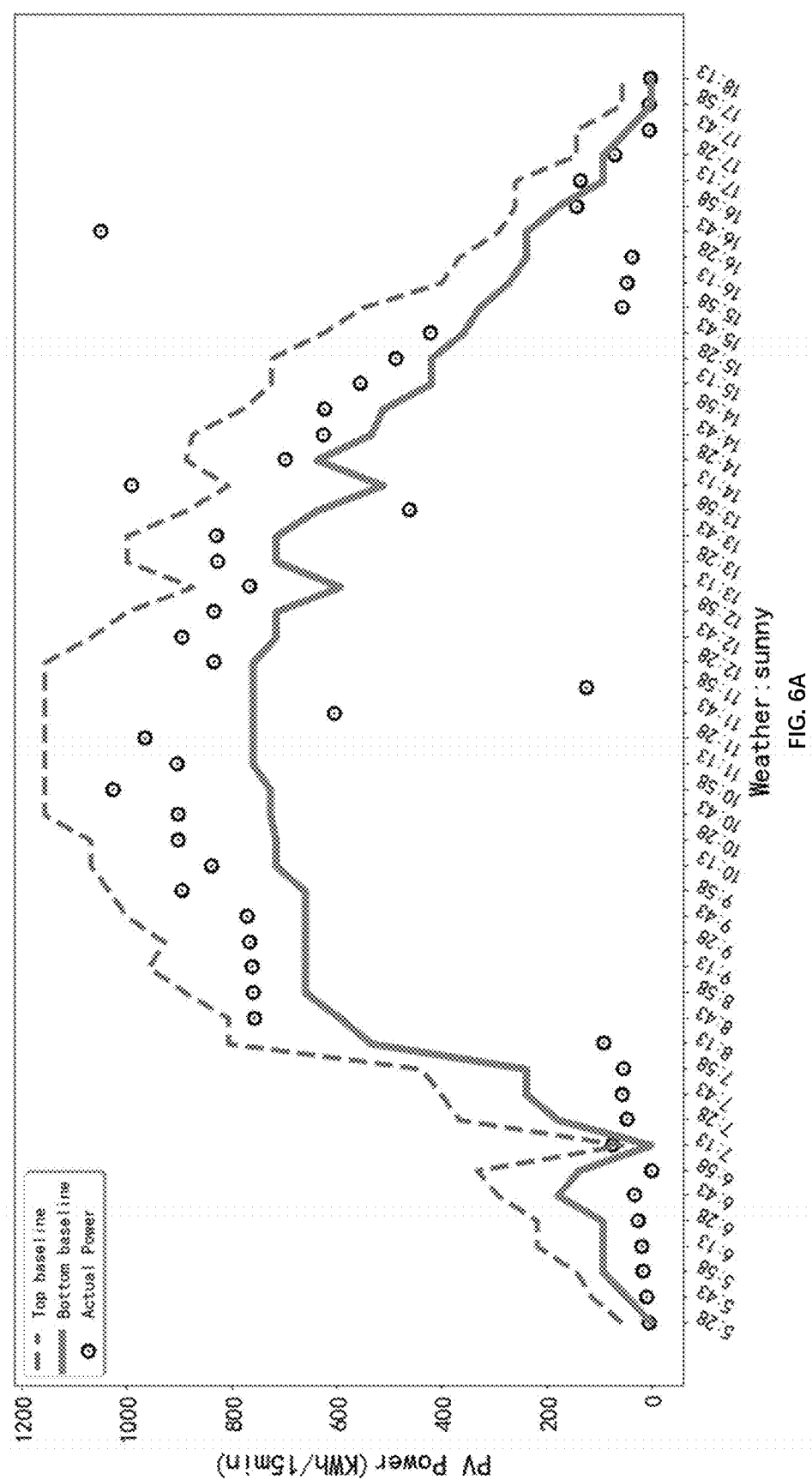
FIG. 6A-B are graphs showing performance evaluation of the system and method for a PV plant and illustrating five kinds of distributions.
Figure 6B:
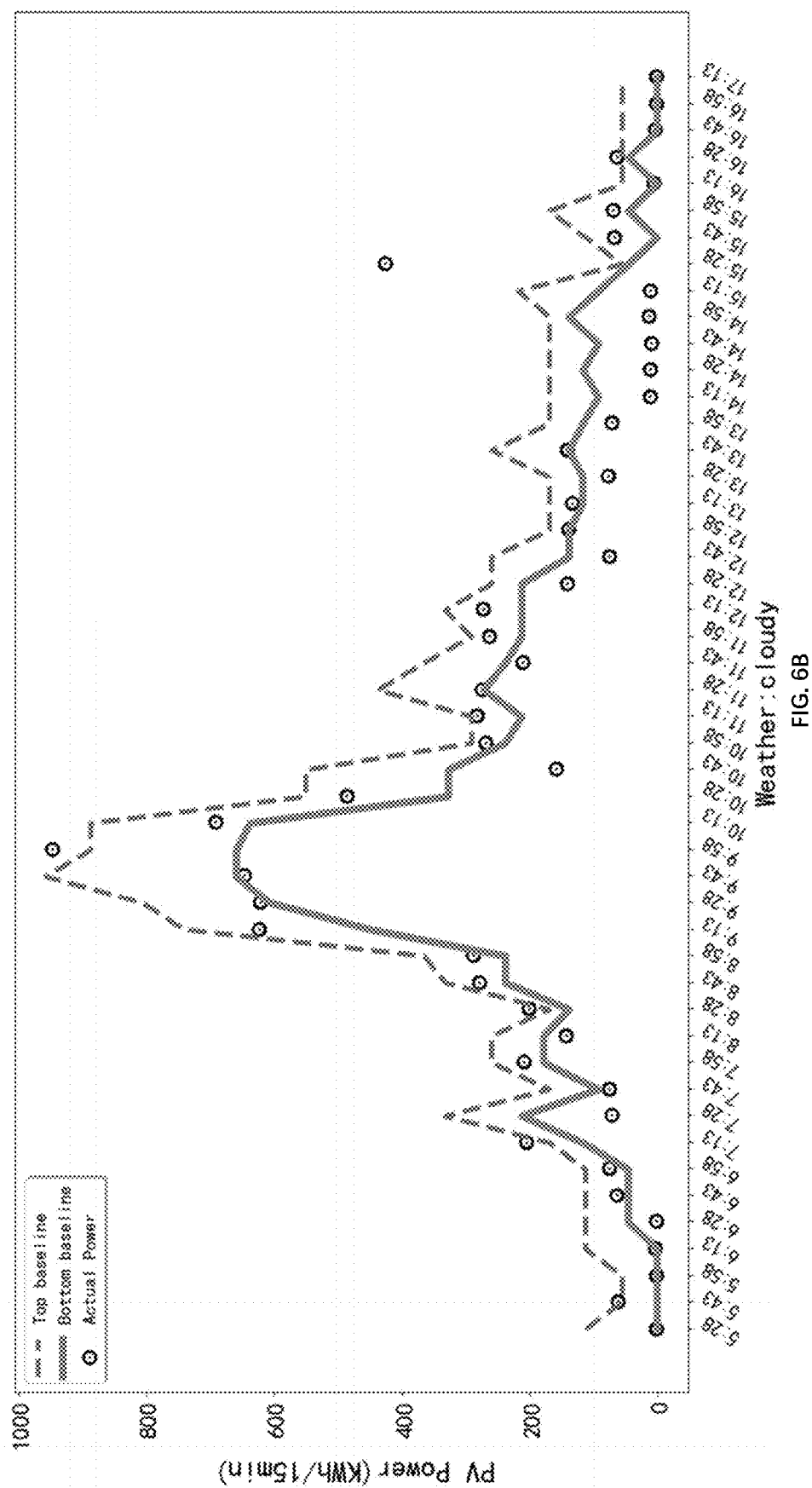

We calculated the maximum value (Max) and the minimum value (Min) of every cluster. Following Algorithm 1, we modified the prediction with the Min and Max values. In addition, we also modified them with weather scale factors. The updated baselines are shown in FIG. 5. Compared to FIG. 4, there is no overlap, and upper reference line remains above the lower reference line for the measurement term. Also, the modified lines are more consistent with the changing trend of actual PV power values. There are also less observations located outside two reference lines.

5) Performance Evaluation, Fault Detection, and O&M Planning

Based on the two modified baseline models, we obtained corresponding upper and lower references of power generation. We compared them with the measured power value, and assessed PV panel status according to their distributions in the reference range. Here, we set $\alpha_1=\beta_1=0.5$ and $\alpha_2=\beta_2=0.1$. To make a comprehensive comparison, we prepared graphs for different weather conditions, namely data for a sunny day is presented in FIG. 7(a) together with the upper and lower curves, and data for a cloudy day is presented in in FIG. 7(b) together with the upper and lower curves. There are 5 kinds of typical distributions. As discussed above, data in Stages 1, 4, and 5 can provide early warning and reminders for the engineers in a PV station. In Stages 1 and 5, actual PV data values deviate far from the reference values. This is the malfunction period, where the sensors may break down and the data transmission may be incorrect. For Stage 5 where the power is relatively low, chances are that there are open circuits or short circuits in PV panels. In Stage 4, the generated power is comparatively low. PV panels are in a downturn period, and may be covered by dust and need cleaning. Stages 2 and 3 do not trigger a warning, because they correspond to an ideal period and transition period, respectively.

Figure 2:
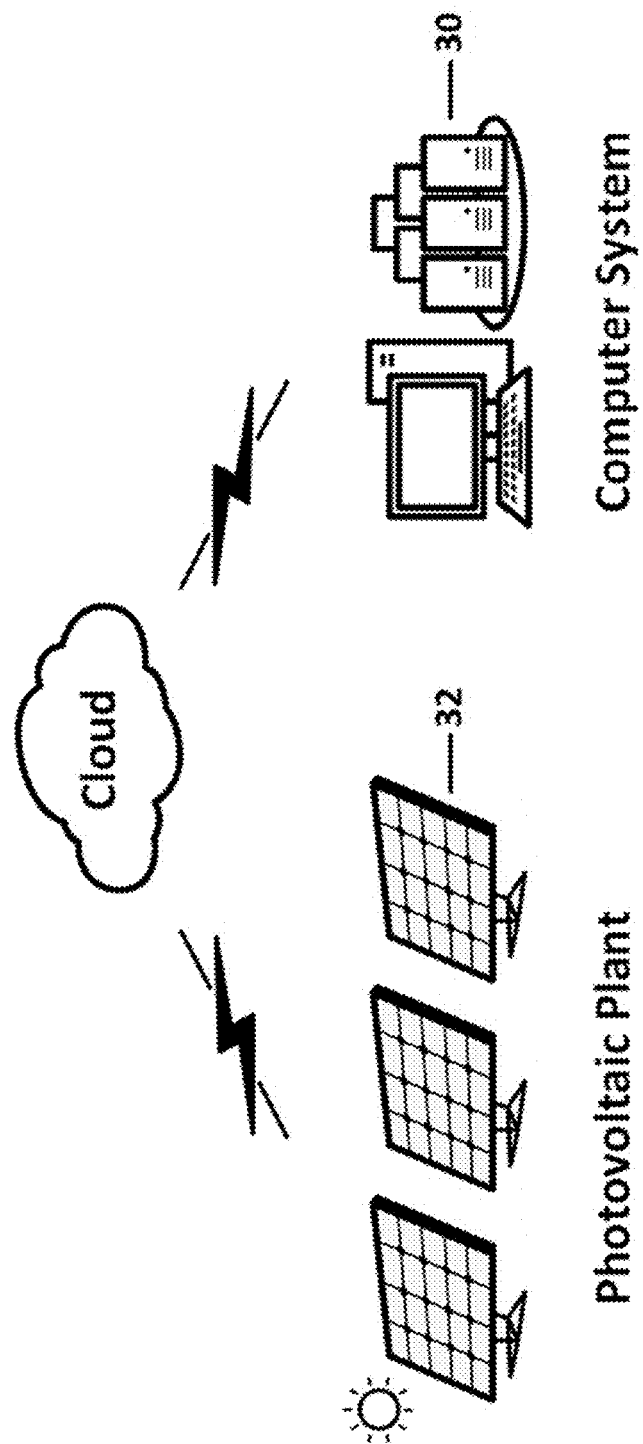
FIG. 2 is a schematic diagram showing a cloud-based implementation of the inventive system and method.

While the system and method depicted in FIG. 1 shows that the detection and display can proceed unsupervisedly, FIG. 2 shows that the computer system 30 (which can include one or a plurality of computers) can be remote from the photovoltaic plant 32, with measured data being transmitted from the photovoltaic plant 32 to the computer system 30, and with warnings and/or other action instructions for the maintenance of the photovoltaic plant 32 being transmitted back from the computer system through a wireless or wired network. The cloud being an exemplary wireless network for use in one embodiment of the system and method described herein.

In order to explicitly present the performance evaluation, the warning boundary lines were displayed (e.g. plotted) in FIGS. 7A-D. With the system and method described herein, the engineers are capable of directly distinguishing the PV panel statuses and getting suggestions about how to carry out proper O&M plans with a reference to the displayed data. Data like that presented in FIG. 7A-D may be presented on a display 18, as shown in FIG. 1. As discussed above, the computer system (30 in FIG. 2) may be local or remote, and functions as a detector 20 in order to notify, and, in some embodiments, provide instructions on proper O&M plans.

Figure 7A:
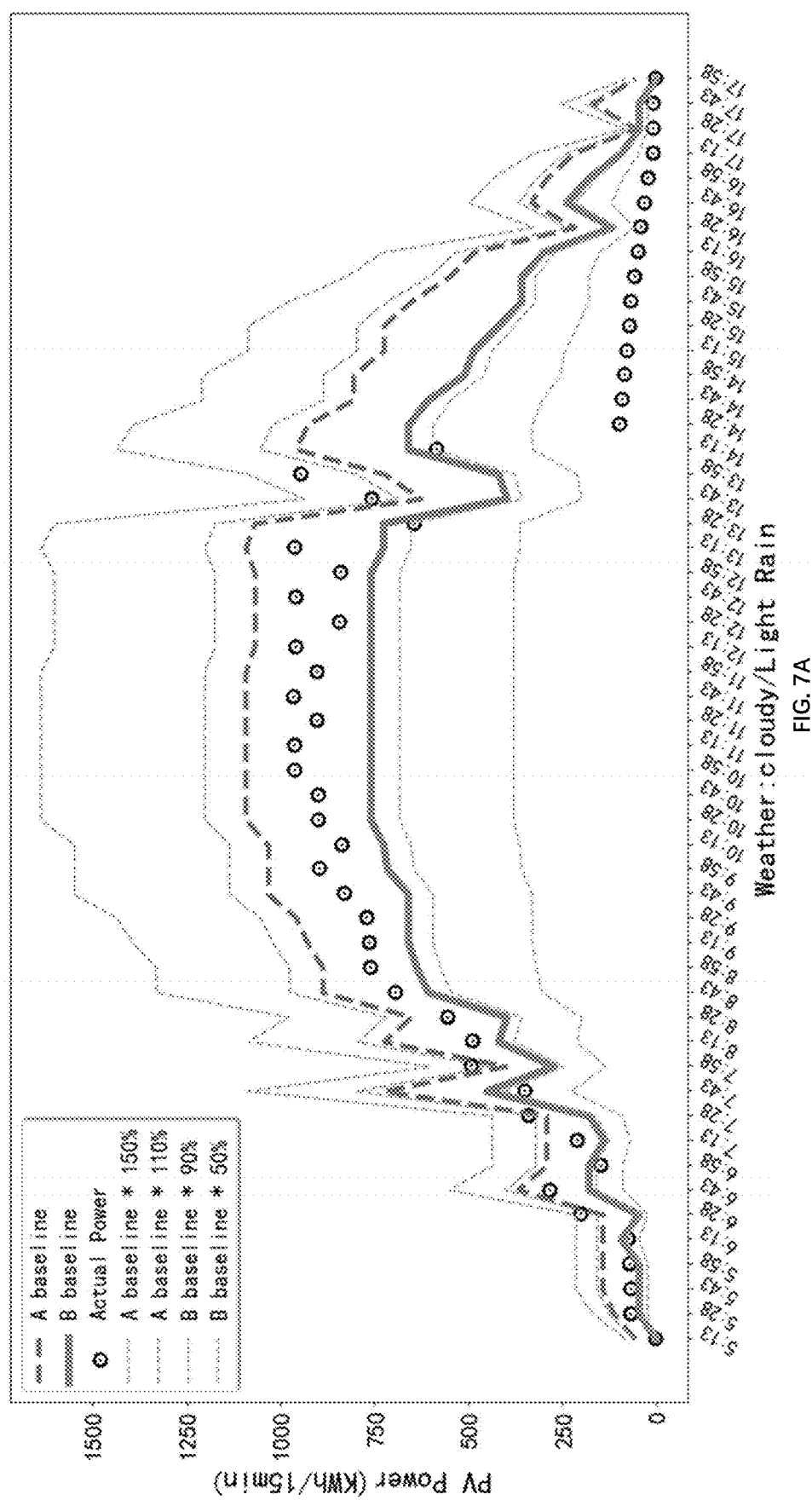
FIGS. 7A-D are graphs showing the performance evaluation of the system and method for a PV plant on four different days, and under different weather conditions.
Figure 7B:
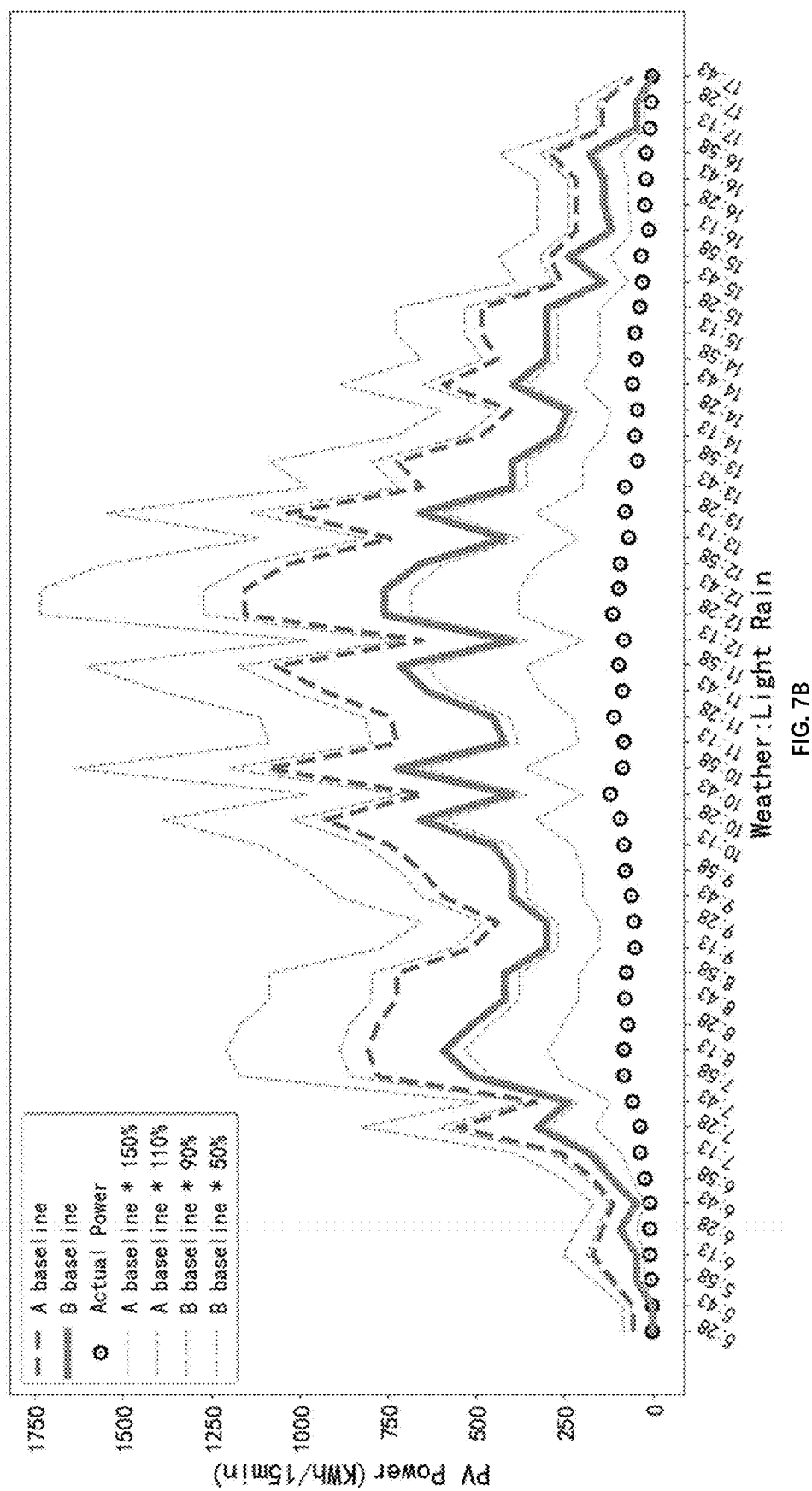

In FIG. 7A, the PV power generation experiences an abrupt decline and drops a lot at 14:28 on that particular day. In FIG. 7B, the PV power generation is far below the lower boundary for the whole day, which indicates that the PV station is in the malfunction period and maintenance is required. According to the abrupt decline and long-lasting Stage 5, it is likely there is a direct fault in the PV plant, e.g., non-connected modules and short/open circuit. Such direct faults are relatively easy to notice in the monitoring system. They usually happen in Stage 5, accompanied by an obvious and long-term decline of PV generation. In this case, further O&M plans lie in checking detailed PV records and then locating the faulty panel(s).

Figure 7C:
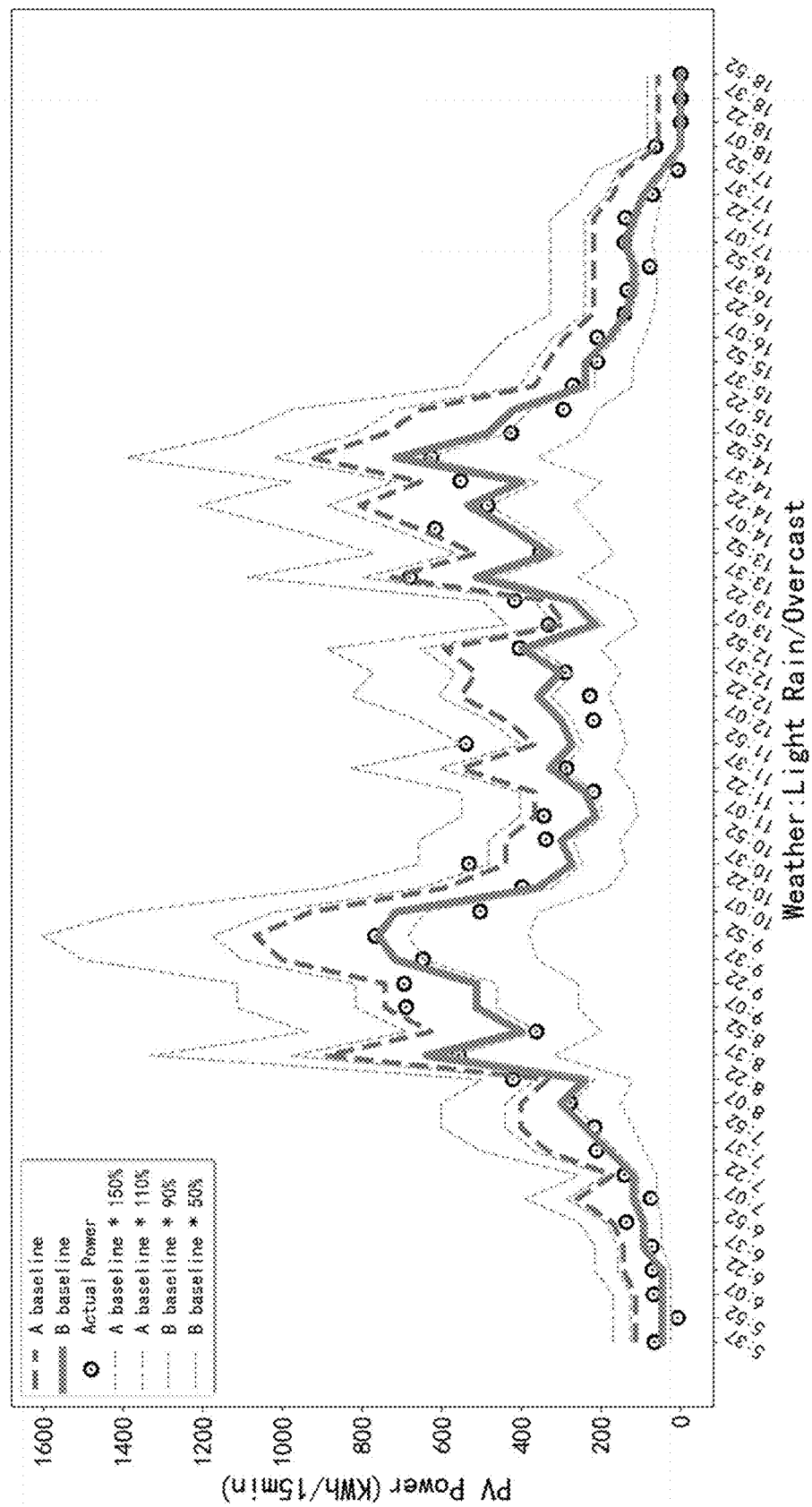

In FIG. 7C, from 14:52 to 18:52 on the monitored day, the PV power is very low and fluctuates near B baseline, and the PV panels are in Stage 4: "downturn period". Dust or light barrier can account for its low efficiency. Further O&M plans ought to focus on water washing or removal of light barriers.

Figure 7D:
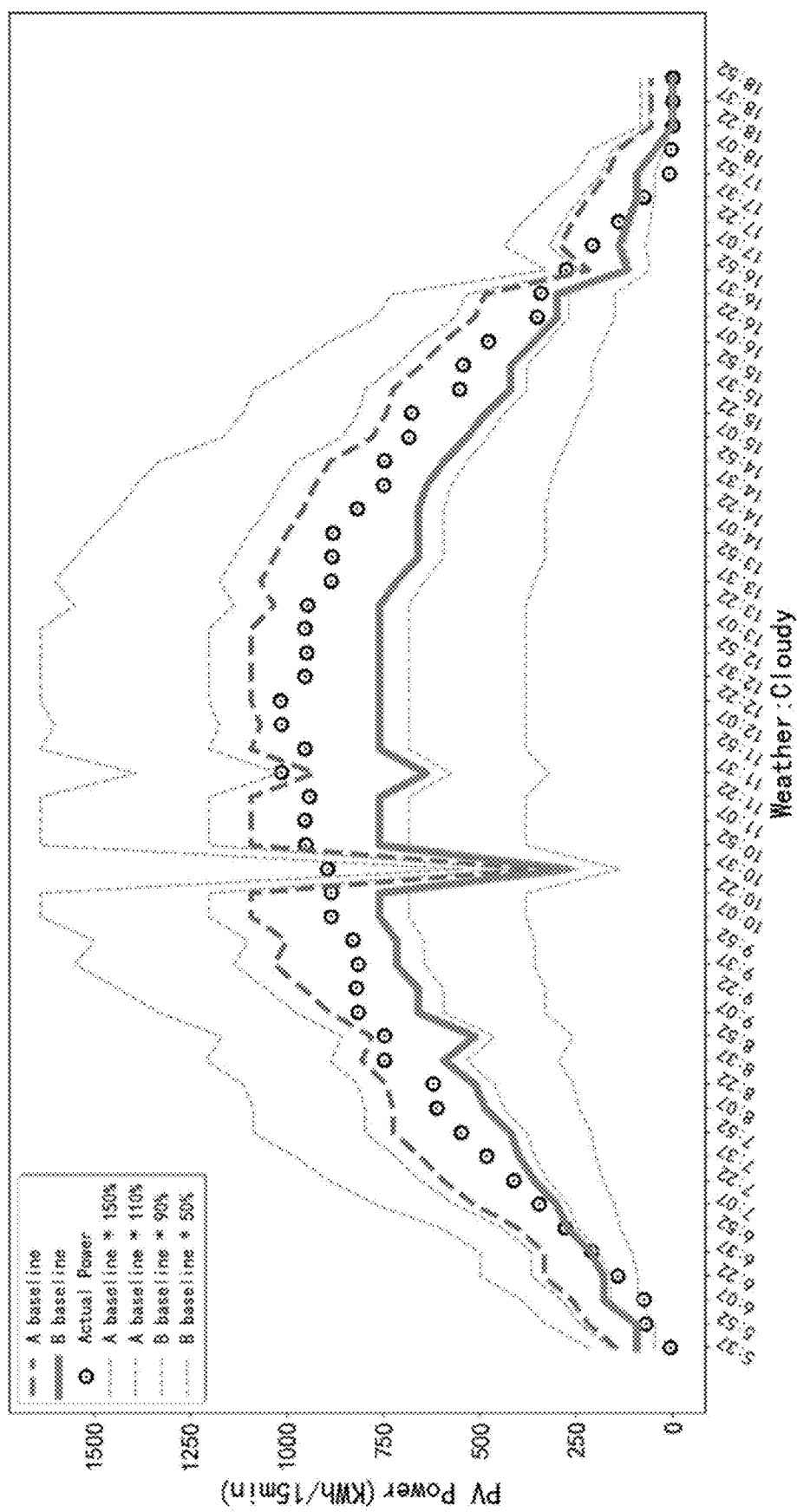

In FIG. 7D, the power evaluation was for a cloudy day in the summer, and the solar irradiance was strong, so the curves of p, a, and b are nearly sinusoids in shape. At 10:37, both A and B baseline fall significantly, whereas the actual p stays in the original trend. Chances are high that meteorological sensor errors or transmission mistakes have occurred. The wrong data are input to our prediction models, so we get wrong upper and lower predictions at the same time. This suggests that further O&M plans attach importance to check original database and repair or replace faulty sensors.

According to the feedback from engineers at a PV plant, our method achieves accurate performance evaluation and fast fault detection. First, our method is able to present instantaneous evaluation for each real-time observation. With the assistance of our method, the O&M engineers do not have to keep their eyes on the curves, and they only check the database when Stages 1 and 4 appear. Second, our method is able to detect both direct and indirect faults in a PV system. It presents an accurate classification with seldom false alarms, and never misses potential anomalous situation, which greatly enhances the operation safety and maintenance efficiency.

6) Discussion

In practical scenarios of PV stations, direct faults, like open circuit and transmission errors, are comparatively easy to notice. There is an abrupt shift from previous trend. Among indirect factors, encapsulation or module degradation is common in the life cycle of PV panels, which is unavoidable. Therefore, the difficult task of O&M in a PV plant is to intelligently implement panel cleaning, including dust removal and anti-blocking. Compared to direct faults, shade reduces a small amount of output power. Deterioration is such a gradual process that many methods fail to detect it. In the past, the cleaning O&M of PV panels was mainly periodically. By contrast, the system and method of the present invention permit detection and displaying to engineers both (1) malfunctions in the photovoltaic power plant when a measured photovoltaic power output obtained using the one or more sensors is either above a first curve constructed from the modified predictive values for the first data set or below a second curve constructed from the modified predictive values for the second data set, and (2) a maintenance requirement for the photovoltaic power plant when the measured photovoltaic power output using the one or more sensors is on or within a threshold adjacent the second curve constructed from the modified predictive values for the second data set. Thus, in addition to more accurate fault detection because of the use of two baseline, the system and method allows, in an unsupervised manner, evaluation of the state of PV panels and provides instantaneous alarm of degradation, such that, for example, cleaning maintenance is triggered only when needed.

The invention claimed is:

1. A system for monitoring and fault detection for a photovoltaic plant, comprising:
   a computer system having
      a first database storing a historical photovoltaic power dataset and a second database storing a historical meteorological dataset,
   one or more sensors for measuring photovoltaic power output from the photovoltaic power plant,
   said computer system trained by
   accessing the first and second databases and performing a feature analysis to build an upper and a lower baseline model, the upper baseline model trained by an ideal period dataset and the lower baseline model trained by a downturn period dataset,
   measuring photovoltaic power output from a photovoltaic power plant with said one or more sensors, or providing measured photovoltaic power output from the photovoltaic power plant;
   classifying measured photovoltaic power as a first data set for an ideal period and a second data set for a downturn period,
      wherein the ideal period is a first time interval when measurements are made when photovoltaic panels are first brought into operation or after the photovoltaic panels have been cleaned,
      wherein the downturn period is a second time interval when measurements are made where photoelectric conversion efficiency of the photovoltaic panels is at a lowest limit, and
      wherein the first and second time intervals are separated by a third time interval where measurements are made where photoelectric conversion efficiency declines from measurements made in the ideal period to a lower limit which characterizes the downturn period;
   cleaning the first data set for the ideal period and the second data set for the downturn period by
      removing outliers from the first data set and second data set, and
      performing regression analysis on the first data set and second data set,
   modifying predictive values for a cleaned first data set and a cleaned second data set by
      generating clusters for data in the cleaned first data set and the cleaned second data set with the power output prediction of cleaned first data and cleaned second data each being assigned to a closest cluster, wherein each cluster has a minimum value and a maximum value, and
      applying a weather scale factor to the modified predictive values of cleaned first data set and the cleaned second data set; and
   an indicator system which indicates on a display or other output device a warning of malfunctions in the photovoltaic power plant when a measured photovoltaic power output obtained using the one or more sensors is either above a first curve constructed from the modified predictive values for the first data set or below a second curve constructed from the modified predictive values for the second data set, and
   wherein the indicator system indicates on the display or the other output device a maintenance requirement for the photovoltaic power plant when the measured photovoltaic power output using the one or more sensors is on or within a threshold adjacent the second curve constructed from the modified predictive values for the second data set,
   whereby the trained computer system provides unsupervised monitoring and fault detection of the photovoltaic plant.

2. The system of claim 1 wherein the weather scale factor is based on one or more of solar irradiance, temperature of the photovoltaic panels, relative humidity, wind velocity, wind direction, and time of day.

3. The system of claim 2 wherein the weather scale factor is also based on one or more of logarithmic value of solar irradiance, logarithmic value of relative humidity, and differential irradiance between two adjacent solar irradiance values for two adjacent time periods.

4. The system of claim 1 wherein the weather scale factor is based on each of solar irradiance, temperature of the photovoltaic panels, relative humidity, wind velocity, wind direction, and time of day.

5. The system of claim 4 wherein the weather scale factor is also based on one or more of logarithmic value of solar irradiance, logarithmic value of relative humidity, and differential irradiance between two adjacent solar irradiance values for two adjacent time periods.

6. The system of claim 1 wherein the computer system is remote from the photovoltaic power plant.

7. The system of claim 6 further comprising
   transmitters, receivers, or transceivers for
      transmitting over a communications network measured photovoltaic power output obtained from the one or more sensors to the computer system, and receiving instructions for the indicator system to indicate malfunctions in the photovoltaic power plant or maintenance requirements for the photovoltaic power plant.

8. A method unsupervised monitoring and fault detection of the photovoltaic plant using a trained computer system comprising the steps of:

providing the computer system with a first database storing a historical photovoltaic power dataset and a second database storing a historical meteorological dataset, said computer system trained by accessing the first and second databases and performing a feature analysis to build an upper and a lower baseline model, the upper baseline model representing an ideal period dataset and the lower baseline model representing a downturn period dataset, measuring photovoltaic power output from a photovoltaic power plant with one or more sensors, or providing measured photovoltaic power output from the photovoltaic power plant;

classifying measured photovoltaic power as a first data set for an ideal period and a second data set for a downturn period, wherein the ideal period is a first time interval when measurements are made when photovoltaic panels are first brought into operation or after the photovoltaic panels have been cleaned, wherein the downturn period is a second time interval when measurements are made where photo electric conversion efficiency of the photovoltaic panels is at a lowest limit, and wherein the first and second time intervals are separated by a third time interval where measurements are made where photoelectric electric efficiency declines from measurements made in the ideal period to a lower limit which characterizes the downturn period;

cleaning the first data set for the ideal period and the second data set for the downturn period by removing outliers from the first data set and second data set, and performing regression analysis on the first data set and second data set, modifying predictive values for a cleaned first data set and a cleaned second data set by generating clusters for data in the cleaned first data set and the cleaned second data set with the cleaned first data and cleaned second data each being assigned to a closest cluster, wherein each cluster has a minimum value and a maximum value, and applying a weather scale factor to the cleaned first data set and the cleaned second data set; and generating an indication on a display or other output device of malfunctions in the photovoltaic power plant when a measured photovoltaic power output obtained using the one or more sensors is either above a first curve constructed from the modified predictive values for the first data set or below a second curve constructed from the modified predictive values for the second data set, and further generating an indication on the display or other output device of a maintenance requirement for the photovoltaic power plant when the measured photovoltaic power output using the one or more sensors is on or within a threshold adjacent the second curve constructed from the modified predictive values for the second data set, whereby the trained computer system provides unsupervised monitoring and fault detection of the photovoltaic plant.

* * * * *